(12) United States Patent
Nguyen et al.

(10) Patent No.: US 9,061,886 B1
(45) Date of Patent: Jun. 23, 2015

(54) DOUBLY-CLAMPED BEAN QUARTZ MICRO-RESONATOR

(71) Applicant: HRL LABORATORIES, LLC, Malibu, CA (US)

(72) Inventors: Hung Nguyen, Los Angeles, CA (US); Deborah J. Kirby, Calabasas, CA (US); David T. Chang, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 13/840,160

(22) Filed: Mar. 15, 2013

(51) Int. Cl.
  *H03H 9/00* (2006.01)
  *B81B 3/00* (2006.01)
  *B81C 1/00* (2006.01)

(52) U.S. Cl.
  CPC ............. *B81B 3/0021* (2013.01); *B81C 1/0015* (2013.01)

(58) Field of Classification Search
  USPC .......... 331/107 R, 116 R, 154, 158; 332/186, 332/199; 310/300, 313 R, 344, 309
  See application file for complete search history.

(56) References Cited

U.S. PATENT DOCUMENTS

| | | | | |
|---|---|---|---|---|
| 6,713,938 | B2 * | 3/2004 | Nguyen | 310/309 |
| 6,909,221 | B2 | 6/2005 | Ayazi et al. | 310/321 |
| 6,954,020 | B2 * | 10/2005 | Ma et al. | 310/309 |
| 7,409,851 | B2 | 8/2008 | Ilic et al. | 73/24.06 |
| 7,555,938 | B2 | 7/2009 | Bargatin et al. | 73/64.53 |
| 7,802,356 | B1 | 9/2010 | Chang et al. | 29/594 |
| 7,830,074 | B2 | 11/2010 | Kubena et al. | 310/361 |
| 2005/0024165 | A1 * | 2/2005 | Hsu | 333/186 |
| 2007/0069605 | A1 * | 3/2007 | Klaasse et al. | 310/309 |
| 2009/0140356 | A1 * | 6/2009 | Yazdi | 257/415 |

* cited by examiner

*Primary Examiner* — Joseph Chang
*Assistant Examiner* — Jeffrey Shin
(74) *Attorney, Agent, or Firm* — Ladas & Parry

(57) ABSTRACT

A resonator includes a base substrate with anchor pads, and a quartz resonator device including a resonant microbridge with an electrode, a first flexure beam connected to an end of the microbridge, a second flexure beam connected to a second end of the microbridge, a first and second spring connected between the first flexure beam and first and second anchor mounts, respectively, a third and fourth spring connected between the second flexure beam and third and fourth anchor mounts, respectively, the anchor mounts connected to anchor pads on the base substrate. A single crystal quartz includes the microbridge, the flexure beams, the springs, and the anchor mounts. The flexure beams and the springs prevent buildup of stress in the microbridge.

31 Claims, 12 Drawing Sheets

DOUBLY-CLAMPED BEAN QUARTZ MICRO-RESONATOR

STATEMENT REGARDING FEDERAL FUNDING

This invention was made under U.S. Government contract HR001-10-C-0109. The U.S. Government has certain rights in this invention.

CROSS REFERENCE TO RELATED APPLICATIONS

None

TECHNICAL FIELD

This disclosure relates to quartz based micro-electro-mechanical systems (MEMS) resonators, and in particular to resonators for ultra-stable oscillators on high vibration platforms.

BACKGROUND

Prior art quartz resonators have shown generally very good performance in terms of stability and phase noise. However, there is still a need for higher performance resonators.

U.S. Pat. No. 7,802,356 to Chang describes a method of fabricating an ultra-thin quartz resonator component, which has cantilever beam as a structure. A disadvantage of cantilever resonators is that they are known to suffer large out-of-plane deflection when an acceleration force is applied, which may especially occur on high vibration platforms.

Doubly or dual clamped beam resonators are described in the prior art. U.S. Pat. No. 7,409,851 to Ilic et al. describes a nanomechanical cantilever beam oscillator, and also a dual clamped end nanomechanical beam oscillator. U.S. Pat. No. 6,909,221 to Ayazi et al. describes a piezoelectric beam resonator. U.S. Pat. No. 7,555,938 to Bargatin et al. describes a nanoelectromechanical (NEMS) peizoresistive cantilever. These prior art references use inferior materials that are easier to manufacture, such as silicon (Si), silicon carbide (SiC) and aluminum nitride (AlN); however, these materials do not match the stability and performance of quartz.

What is needed is a resonator with high stability, including stability to out-of-plane acceleration forces. Also needed is a method for fabricating such resonators. The embodiments of the present disclosure answer these and other needs.

SUMMARY

In a first embodiment disclosed herein, a resonator comprises a base substrate having a first, second, third and fourth anchor pads, a quartz resonator device including a resonant microbridge, an electrode on the microbridge, a first flexure beam connected to a first end of the microbridge, a second flexure beam connected to a second end of the microbridge, a first spring connected between the first flexure beam and a first anchor mount, the first anchor mount coupled to the first anchor pad, a second spring connected between the first flexure beam and a second anchor mount, the second anchor mount coupled to the second anchor pad, a third spring connected between the second flexure beam and a third anchor mount, the third anchor mount coupled to the third anchor pad, a fourth spring connected between the second flexure beam and a fourth anchor mount, the fourth anchor mount coupled to the fourth anchor pad, wherein a single crystal quartz comprises the microbridge, the first and second flexure beams, the first, second, third and fourth springs, and the first, second, third and fourth anchor mounts, and wherein the flexure beams and the springs prevent buildup of stress in the microbridge.

In another embodiment disclosed herein, a method of fabricating a method of fabricating a resonator comprises depositing top-side metal on a top of a quartz device wafer to form a resonator electrode, bonding a quartz handle to the quartz device wafer, thinning and planarizing the quartz device wafer to achieve a desired thickness and uniformity, patterning and etching the quartz device wafer to form a via for electrical contact between the top and a bottom of the quartz device wafer, depositing metal to form a via interconnect between the top and the bottom of the quartz device wafer, depositing and patterning bottom side metal to form a bottom side resonator electrode, etching the thinned quartz device wafer to form a resonant microbridge, a first flexure beam connected to a first end of the microbridge, a second flexure beam connected to a second end of the microbridge, a plurality of anchor mounts, and a respectively plurality of springs, each spring between a respective anchor mount and the first flexure beam or the second flexure beam, bonding each anchor mount to a respective anchor pad on a base substrate, and releasing the bond between the quartz handle and the quartz device wafer.

In another embodiment disclosed herein, a resonator comprises a base substrate having a first and second anchor pads, a quartz resonator device comprising a resonant microbridge, a first flexure beam connected to a first end of the microbridge, a second flexure beam connected to a second end of the microbridge, a first spring connected between the first flexure beam and a first anchor mount, the first anchor mount coupled to the first anchor pad; and a second spring connected between the second flexure beam and a second anchor mount, the second anchor mount coupled to the second anchor pad, wherein a single crystal quartz comprises the microbridge, the first and second flexure beams, the first and second, and the first and second anchor mounts.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

A good oscillator is characterized by the resonator's frequency stability Δf/f. The slightest fluctuation in the oscillation frequency can degrade a resonator performance which is ultimately reflected in the phase noise of the oscillator circuit.

Figure 1:
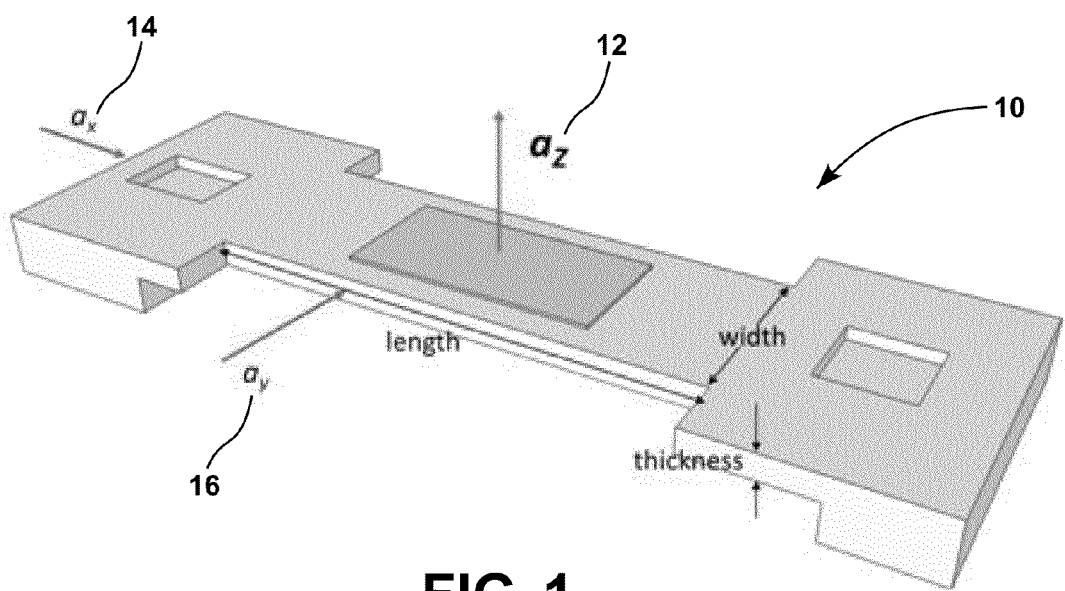
FIG. 1 shows a doubly clamped resonator in accordance with the present disclosure.

Although a quartz resonator generally operates in a thickness shear mode which maintains an oscillation frequency well beyond the frequency range of mechanical vibrations, a quartz resonator may still be susceptible to large axial strains leading to shifts in the resonant frequency. For a doubly clamped resonator, such as doubly clamped resonator 10 shown in FIG. 1, an out-of-plane deflection $a_z$ 12 of the beam resonator beam dominates any in-plane motion $a_x$ 14 or $a_y$ 16, as illustrated in FIG. 1. It is desirable to minimize frequency drifts due to out-of-plane vibrations. A resonator according to the present disclosure needs to perform reliably under vibrations of 20 g at frequencies between 5 Hz to 5 kHz.

A doubly-clamped quartz micro-resonator offers a significant improvement in frequency stability over traditional cantilever-based resonators. In the presence of mechanical vibrations, an out-of-plane acceleration applied to a cantilever resonator, such as that described in U.S. Pat. No. 7,802,356 to Chang, which is incorporated herein as though set forth in full, may result in a large deflection and bending stress. One can compare the difference in the restoring force or "stiffness" of a doubly-clamped beam to the more compliant cantilever beam by taking the ratio of the doubly-clamped and cantilever beam equations in (1) and (2).

$$F_{doubly\ clamped} = F_{DC.linear} + F_{DC.nonlinear} = \frac{192EI}{L^3}d + 11.52\frac{Ewt}{L^3}d^3 \quad (1)$$

$$F_{cantilever} = F_{C.linear} + F_{C.nonlinear} = \frac{3EI}{L^3}d + 0.19\frac{Ewt^3}{L^5}d^3 \quad (2)$$

$$\frac{F_{DC.linear}}{F_{C.linear}} = 64 \quad \frac{F_{DC.nonlinear}}{F_{C.nonlinear}} \approx 60\left(\frac{L}{t}\right)^2 \quad (3)$$

$F_{DC}$ and $F_C$ are the restoring forces of the doubly-clamped beam and cantilever resonator respectively. The variables E, I, L, w, t, and d are Young's modulus, moment of inertia, beam length, width, thickness, and deflection. Based on equation (3) and typical resonator dimensions, the doubly-clamped resonator has linear and nonlinear restoring forces that are at least 66 and 600 times greater than those of a comparably-sized cantilever resonator. An increase in the restoring force effectively reduces the resultant beam deflection. Thus the doubly-clamped resonator is intrinsically less sensitive to external vibrations than a comparably sized cantilever.

One disadvantage of a doubly-clamped resonator is its rigidity due to having a resonator that is anchored on both ends, which does not allow for in-plane strains when fluctuations in the external temperatures causes thermal mismatches between the resonator and the mounting structure, such as a substrate. Additional stress can build in the resonator when the quartz and substrate expand or contract at different rates.

Figure 2A:
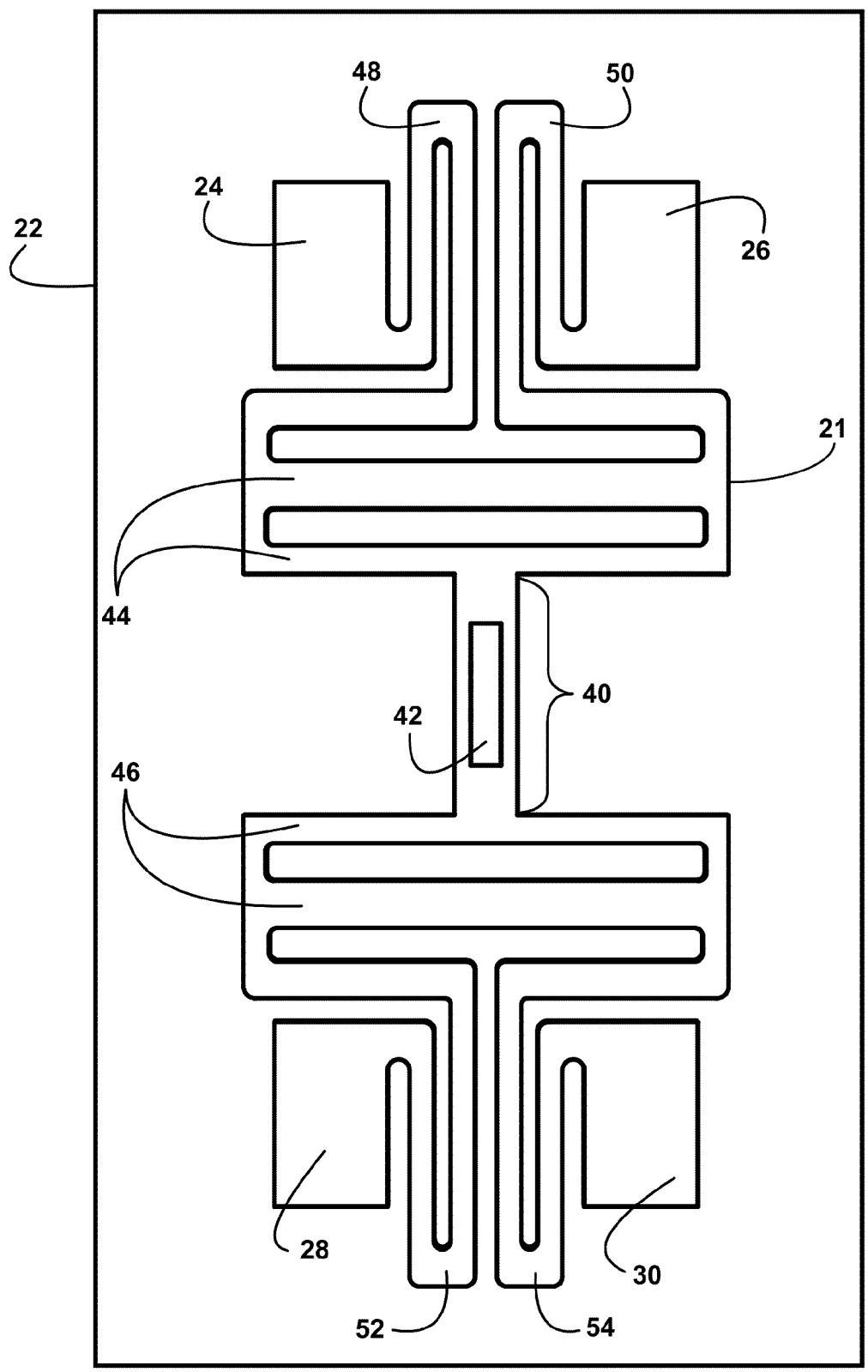
FIG. 2A shows a top view of a doubly clamped resonator with springs and flexure beams in accordance with the present disclosure.

FIG. 2A shows a top view of a doubly clamped resonator 21 mounted on a base substrate 22. The quartz dual clamped resonator has a beam 40, which may be referred to as a resonant microbridge, and an active electrode 42.

On one end of the beam 40 is flexure beam 44 and on the other end of the beam 40 is flexure beam 44. The flexure beams 44 and 46 have the purpose of compensating for any thermal stress that builds along the length of the beam 40. The flexure beams 44 and 46 are formed by removed portions or cutouts in the quartz dual clamped resonator 21.

The dual clamped resonator 21 is mounted to anchor pads on the base substrate 22 at anchor mounts 24, 26, 28 and 30. To compensate for stress that can build in the resonator when the quartz dual clamped resonator 21 and substrate 22 expand or contract at different rates, springs 48 and 50 are between the anchor mounts 24 and 26 and the flexure beam 44. Similarly, springs 52 and 54 are between the anchor mounts 28 and 30 and the flexure beam 46. The springs 48, 50, 52, and 54 are formed by removed portions or cutouts in the quartz dual clamped resonator 21. The springs may be a serpentine configuration and also have an opposing serpentine configuration, as shown in FIG. 2A.

The beam or microbridge, the flexure beams, the springs and the anchor mounts are constructed from a single quartz crystal. The springs 48, 50, 52, and 54 near the anchor mounts and the flexure beams 44 and 46 deflect in tandem to prevent buildup of thermal and mechanical stress in the active region of beam or microbridge 40.

Figure 2B:
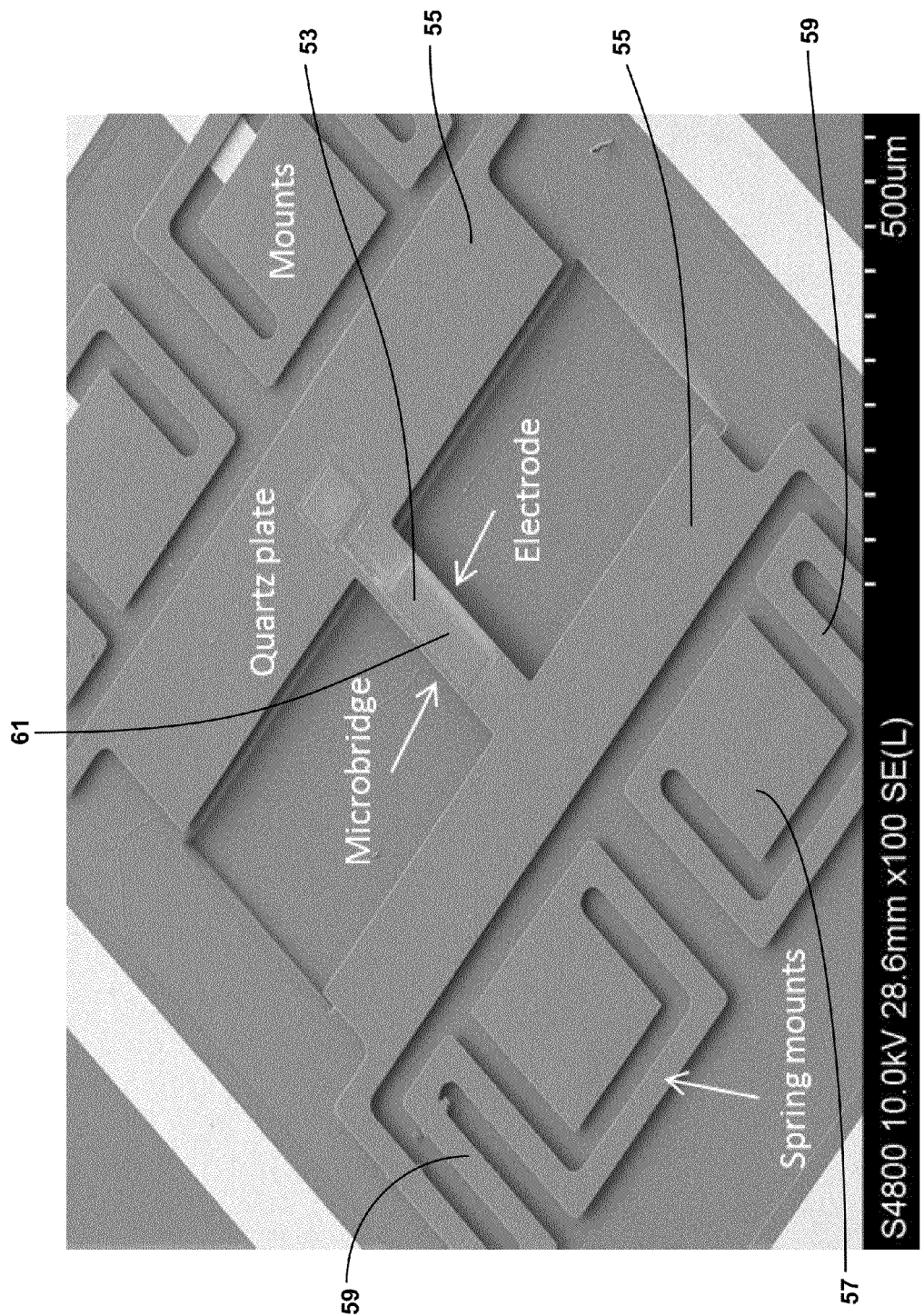
FIG. 2B shows a scanning electron micrograph of a quartz-based doubly-clamped micro-resonator with springs and flexure beams in accordance with the present disclosure.

FIG. 2B shows a scanning electron micrograph (SEM) image of a quartz-based doubly-clamped micro-resonator with springs and flexure beams in accordance with the present disclosure. The doubly-clamped quartz micro-resonator consists of a quartz resonating beam 53 whose length dominates its width and thickness. In the embodiment shown in FIG. 2B, the beam 53 is 3 μm thick to achieve a 500 MHz oscillation frequency; however, the beam thickness can be varied for a desired oscillation frequency. The beam 53 width and length in the embodiment of FIG. 2B are 80 and 260 μm respectively. At either end of the beam 53 are quartz plates 55 of equal thickness that provide the flexure beams. In some embodiments the quartz plate 55 may have cutouts as shown for flexure beams 44 and 46 of FIG. 2A. As shown in FIG. 2B, stress-relief springs 59 are between anchor mounts 57 and the quartz plate 55. The springs 59 are designed to absorb thermal strains due to the mismatch between the quartz and the underlying substrate, leaving the active region of the beam 53 free of stress. The active region of the quartz beam in FIG. 2B is 50×160 μm2 in area. The active quartz region and a conductive electrode 61 are positioned at the midpoint of the doubly-clamped beam 53 to minimize stress propagation originating from the anchor mounts.

Figure 3A:
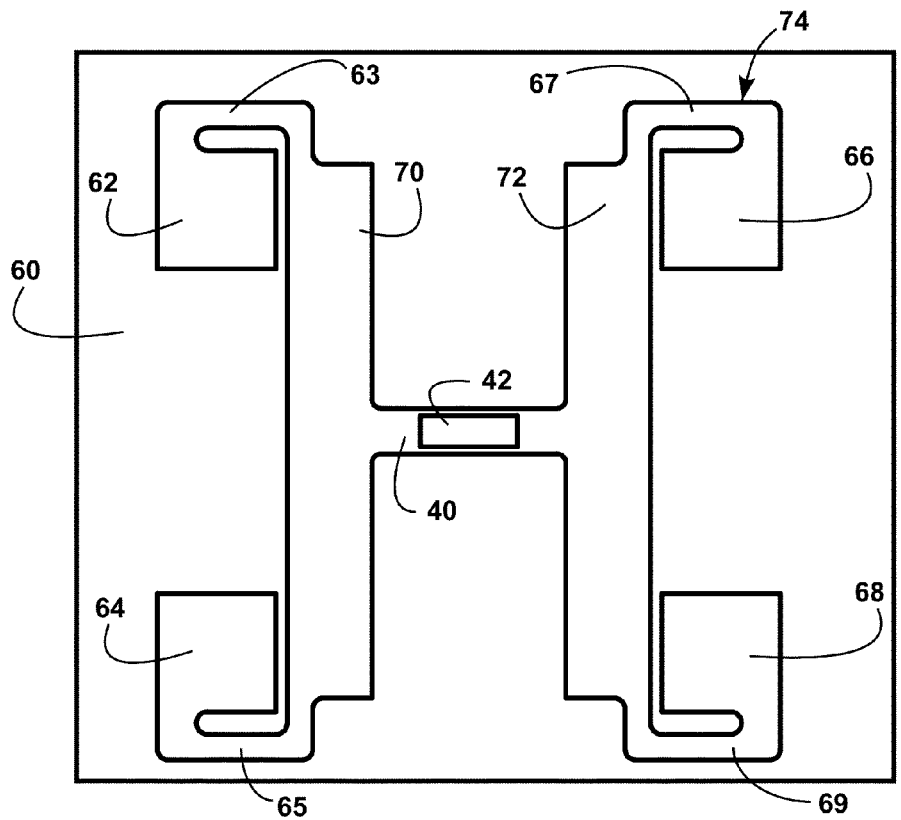
FIGS. 3A and 3B show top views of other doubly clamped resonators in accordance with the present disclosure.
Figure 3B:
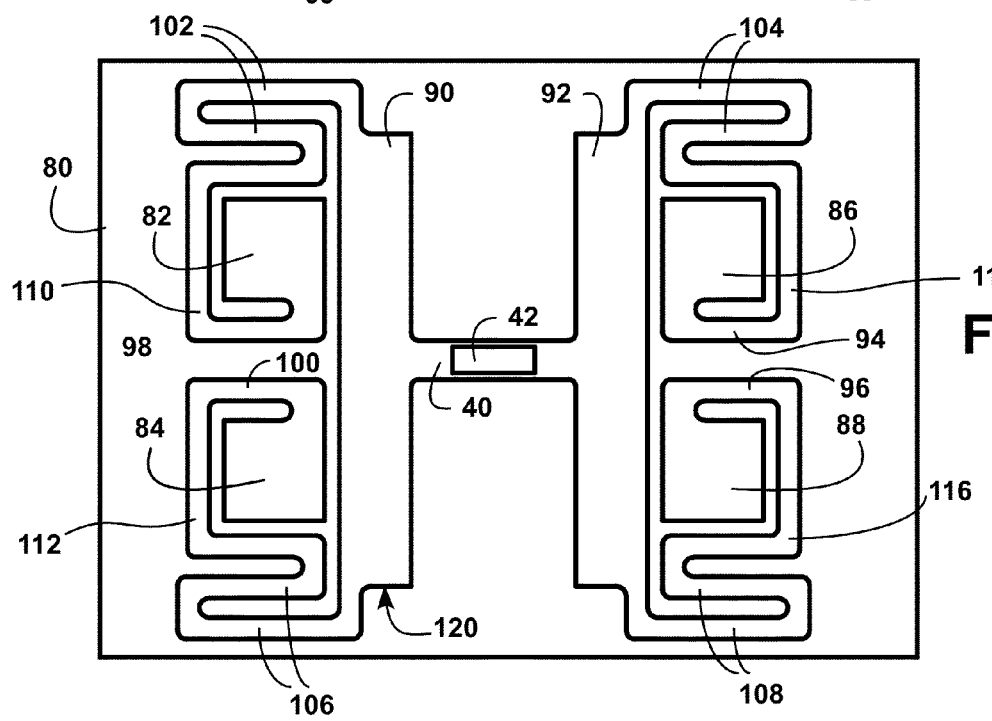

FIGS. 3A and 3B show top views of other doubly clamped resonators in accordance with the present disclosure, and demonstrate that the quartz dual clamped resonator 21 may have many configurations.

FIG. 3A shows a quartz dual clamped resonator 74 mounted on a base substrate 60. The quartz dual clamped resonator has a beam 40, which together with an active electrode 42, forms the dual clamped resonator. On one end of the beam 40 is flexure beam 70 and on the other end of the beam 40 is flexure beam 72. In this embodiment the flexure beams 70 and 72, which may also be referred to as quartz plates, do not have cutouts, but in any event do provide compensation for any thermal stress that builds along the length of the beam 40.

The dual clamped resonator 74 is mounted to substrate 60 at anchor mounts 62, 64, 66 and 68. To compensate for stress that can build in the resonator when the quartz dual clamped resonator 74 and base substrate 60 expand or contract at different rates, springs 63 and 65 are between the anchor mounts 62 and 64 and the flexure beam 70, as shown in FIG. 3A. Similarly, springs 67 and 69 are between the anchor mounts 66 and 68 and the flexure beam 72, as shown in FIG. 3A.

FIG. 3B shows a quartz dual clamped resonator 120 mounted on a base substrate 80. The quartz dual clamped resonator has a beam 40, which together with an active electrode 42, forms the dual clamped resonator. On one end of the beam 40 is flexure beam 90 and on the other end of the beam 40 is flexure beam 92. The flexure beams 90 and 92 have the purpose of compensating for any thermal stress that builds along the length of the beam 40, and in this embodiment the flexure beams 90 and 92 are similar to the flexure beams 70 and 72 in FIG. 3A.

The dual clamped resonator 120 is mounted to the base substrate 80 at anchor mounts 82, 84, 86 and 88. To compensate for stress that can build in the resonator when the quartz dual clamped resonator 120 and base substrate 80 expand or contract at different rates, springs 110, 102, 112 and 106 are between the anchor mounts 82 and 84 and the flexure beam 90, as shown in FIG. 3B. Similarly, springs 114, 104, 116 and 108 are between the anchor mounts 86 and 88 and the flexure beam 92, as shown in FIG. 3B.

FIGS. 4A to 4E are flow diagrams of a method of fabricating dual clamped resonators in accordance with the present disclosure. The fabrication method described herein is generally based on, but is different than, the method described in U.S. Pat. No. 7,830,074 to Kubena et al., which is incorporated herein as though set forth in full.

Wafers used for this fabrication method include a 3" AT-cut quartz device wafer, a 3" quartz handle to temporarily hold a thinned quartz device wafer, a 3" silicon cap wafer, and finally the base substrate onto which the doubly clamped resonator is integrated. A person skilled in the art will understand that different size wafers may be used.

Figure 4A:
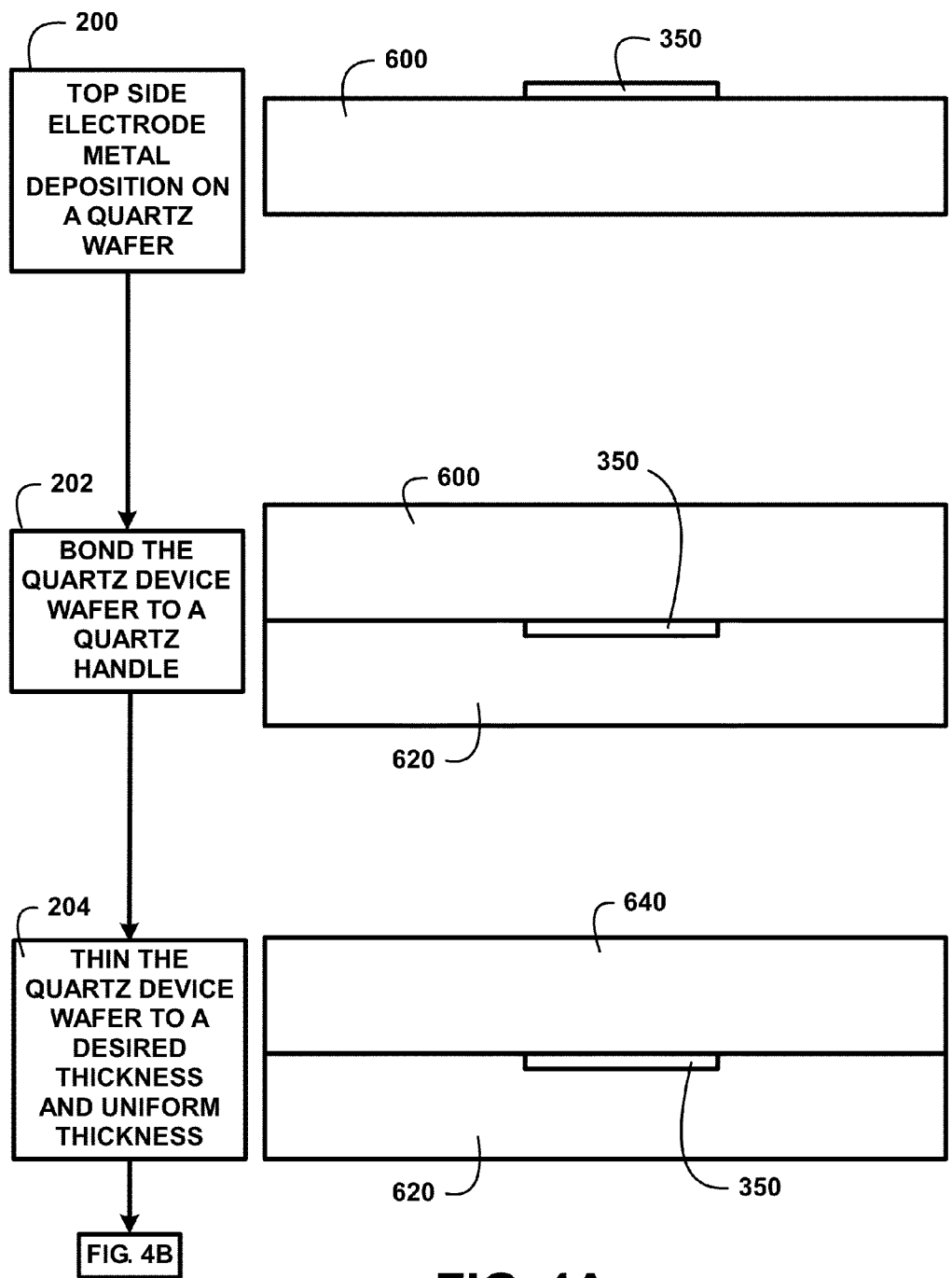
FIGS. 4A to 4E are flow diagrams of a method of fabricating doubly clamped resonators in accordance with the present disclosure.

Referring now to FIG. 4A in step 200, top-side metal 350 is deposited on the quartz device wafer 600. This metal layer, which may be aluminum (Al), gold (Au) or any other suitable metal, forms the resonator electrode. In step 202 the quartz device wafer 600 is fusion bonded to a quartz handle or carrier 620. Alternatively, one can use petroleum-based wax or other temporary adhesive to bond the quartz handle 620 to the quartz device wafer 600. Then in step 204, the quartz device wafer 600 is ground down and planarized using chemical mechanical planarization (CMP) and selective milling to achieve a desired thickness and uniformity. The result is thinned and planarized quartz device wafer 640.

Figure 4B:
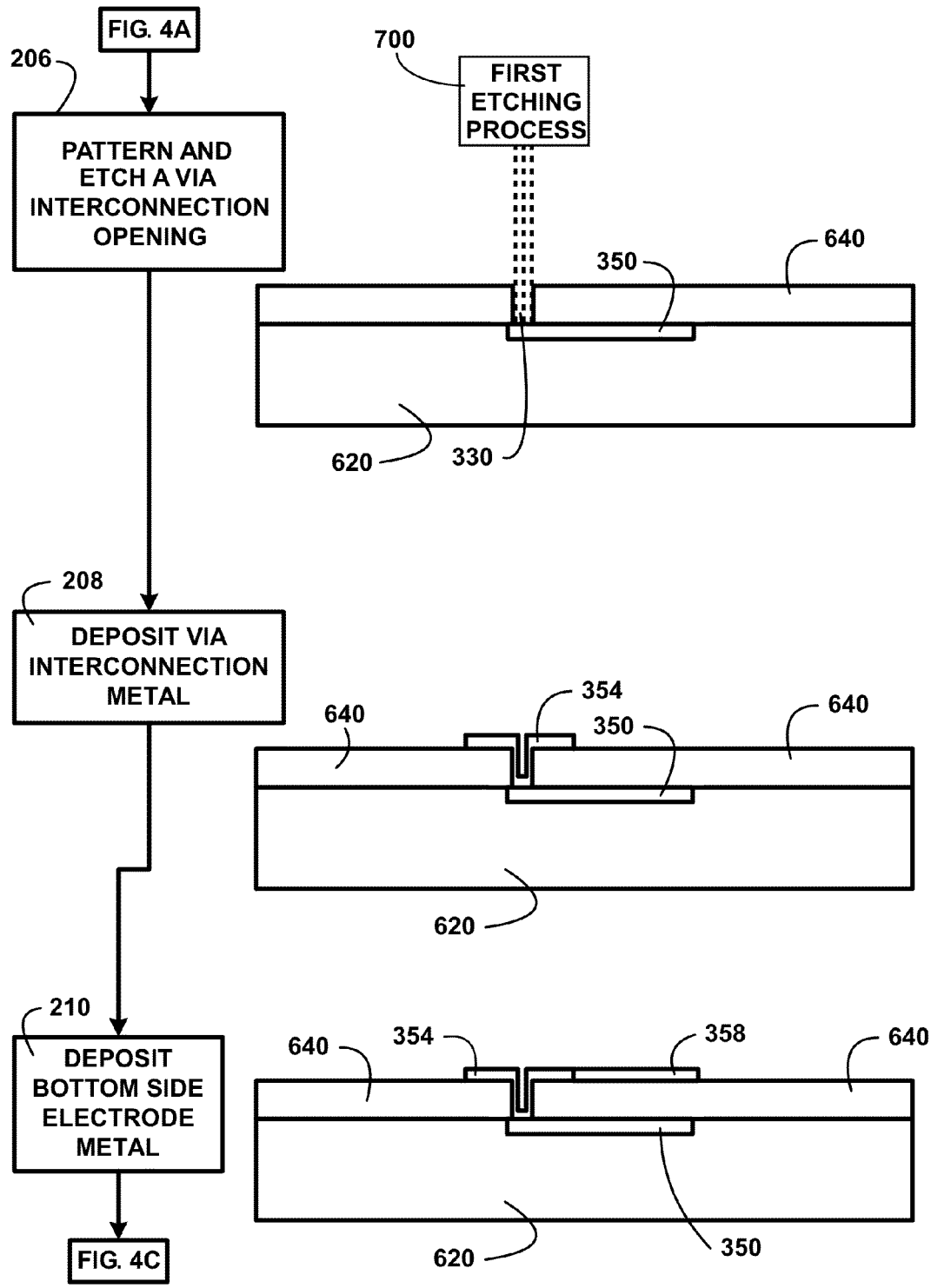

Next in step 206, shown in FIG. 4B, the thinned quartz device wafer 640 is patterned and etched using an inductively coupled plasma (ICP) dry etcher to create a via 330 that allows for electrical contact between the top and bottom sides of the thinned quartz device wafer 640. Next in step 208 metal 354, which may be Al, is deposited to form the via interconnect. Then in step 210 bottom side metal 354 and 358, which may be Al, is deposited and patterned to create the bottom side resonator electrode.

Figure 4C:
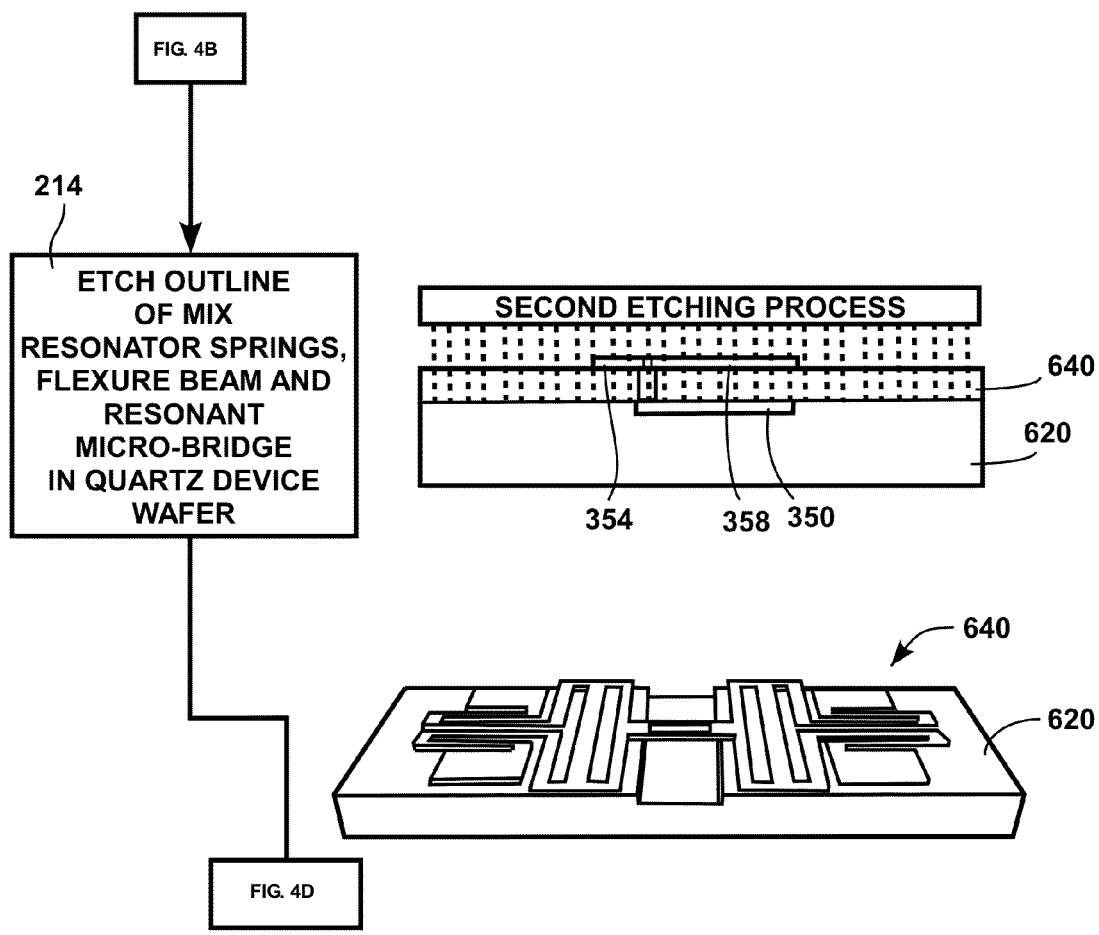

Next, in step 214 shown in FIG. 4C, a second dry etch of the thinned quartz device wafer 640 is performed to carve out the device outline which includes springs, such as springs 48, 50, 52, and 54 in FIG. 2A, flexure beams, such as flexure beams 44 and 46 in FIG. 2A, and a resonant microbridge, such as beam 40 in FIG. 2A, to form a finished quartz device 640, as shown in FIG. 4C.

Figure 4D:
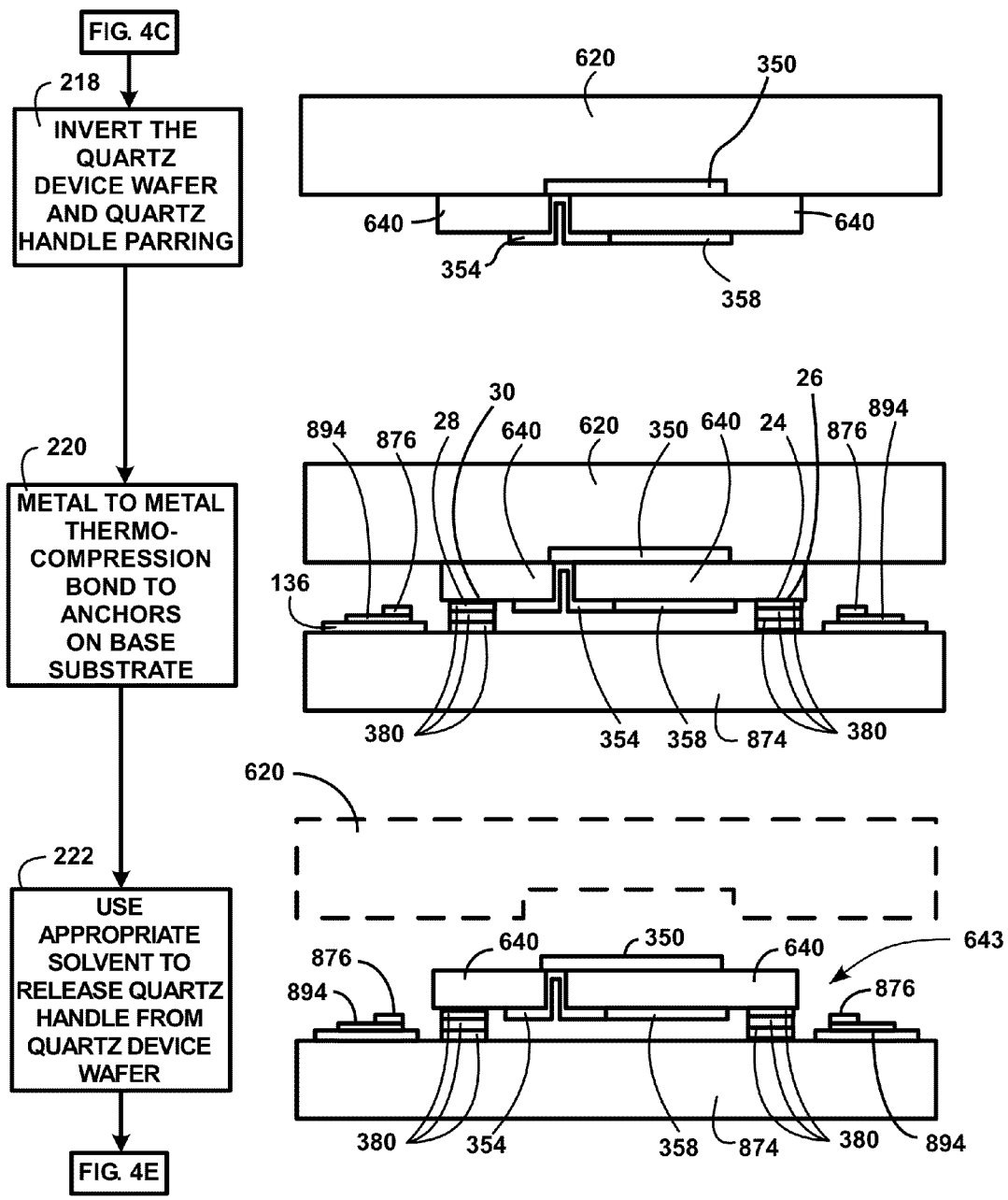

Then in step 218 as shown in FIG. 4D, the finished quartz device/quartz handle pair is inverted. Then in step 220 the finished quartz device is integrated onto the base substrate 874 by means of metal-metal thermo-compression bonding. As shown in FIG. 4D, anchor mounts 24, 26, 28 and 30 are bonded to anchor pads 380 on the base substrate 874. Other structures may also be on the base substrate 874, such as sealing rings 876 and 894.

Then in step 222, the bonded quartz device/quartz handle pair and base substrate 874 are soaked in an appropriate solvent to un-bond or dissolve the adhesive between the quartz device 640 and the quartz handle 620, thus releasing the dual clamped resonator 643, as shown in FIG. 4D, from the quartz handle 620.

Figure 4E:
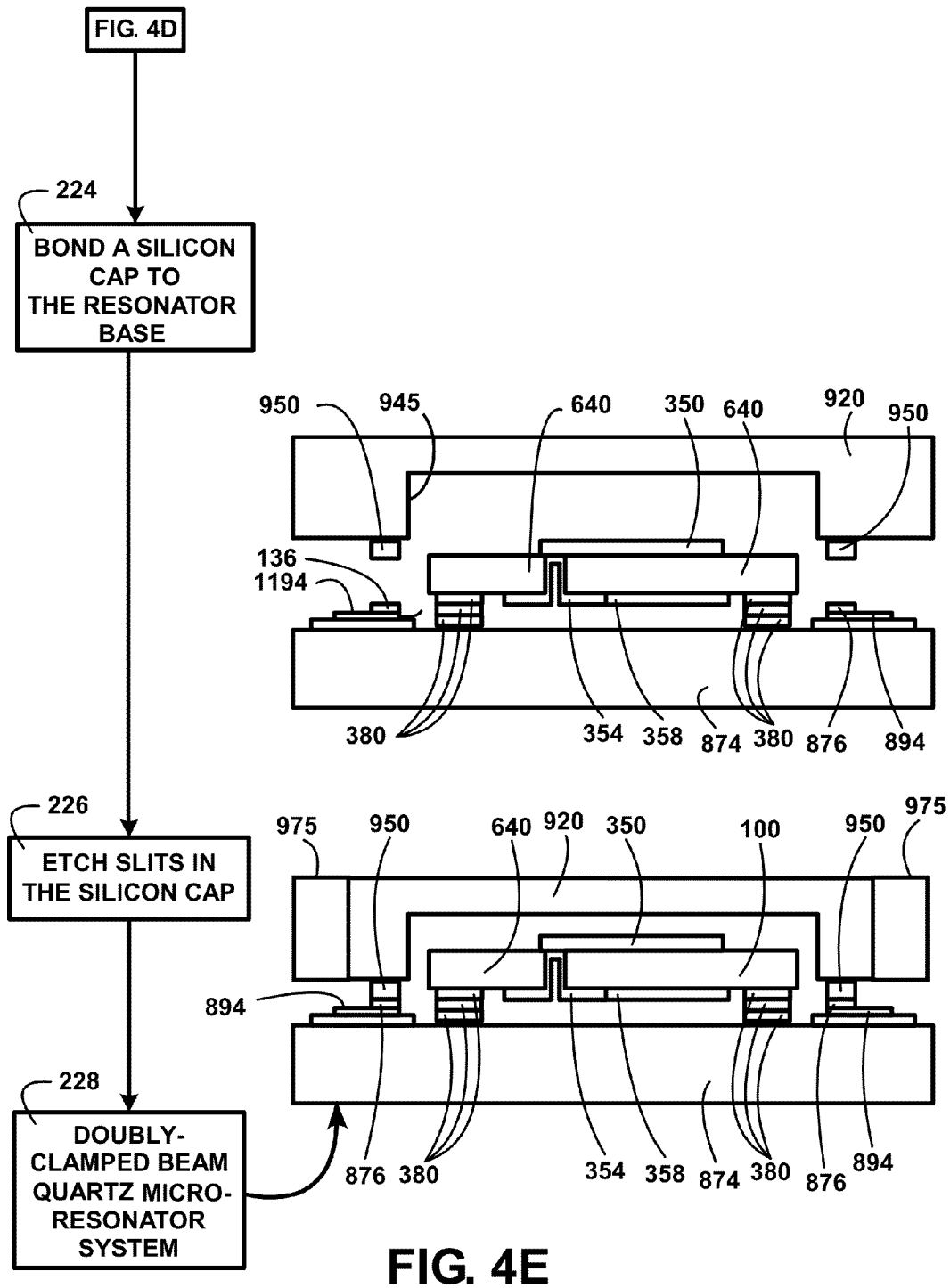

Next in step 224, shown in FIG. 4E, a silicon cap 920, which has a cavity 945 and seal ring 950, is bonded to the sealing rings 876, 894 on the base substrate 874 to keep the quartz oscillator in a stable environment. The silicon cap 920 is aligned and bonded to the base substrate 874 under vacuum or in an inert atmosphere. In step 226, slits 975 may be etched in the silicon cap to provide for a heat exchanger. The result is the doubly clamped beam quartz micro-resonator system shown in step 228.

Figure 5:
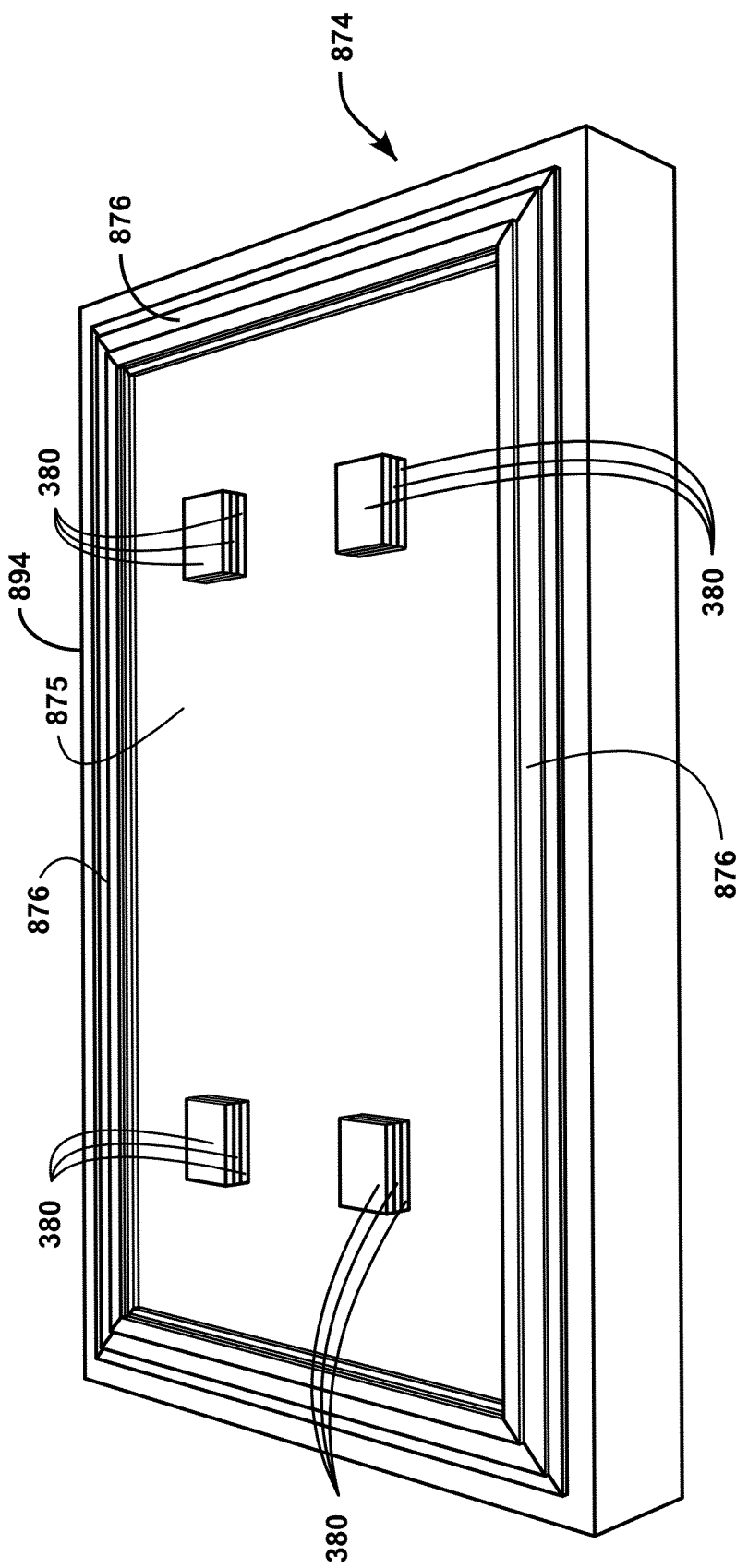
FIG. 5 shows anchors on a base substrate in accordance with the present disclosure.
Figure 6:
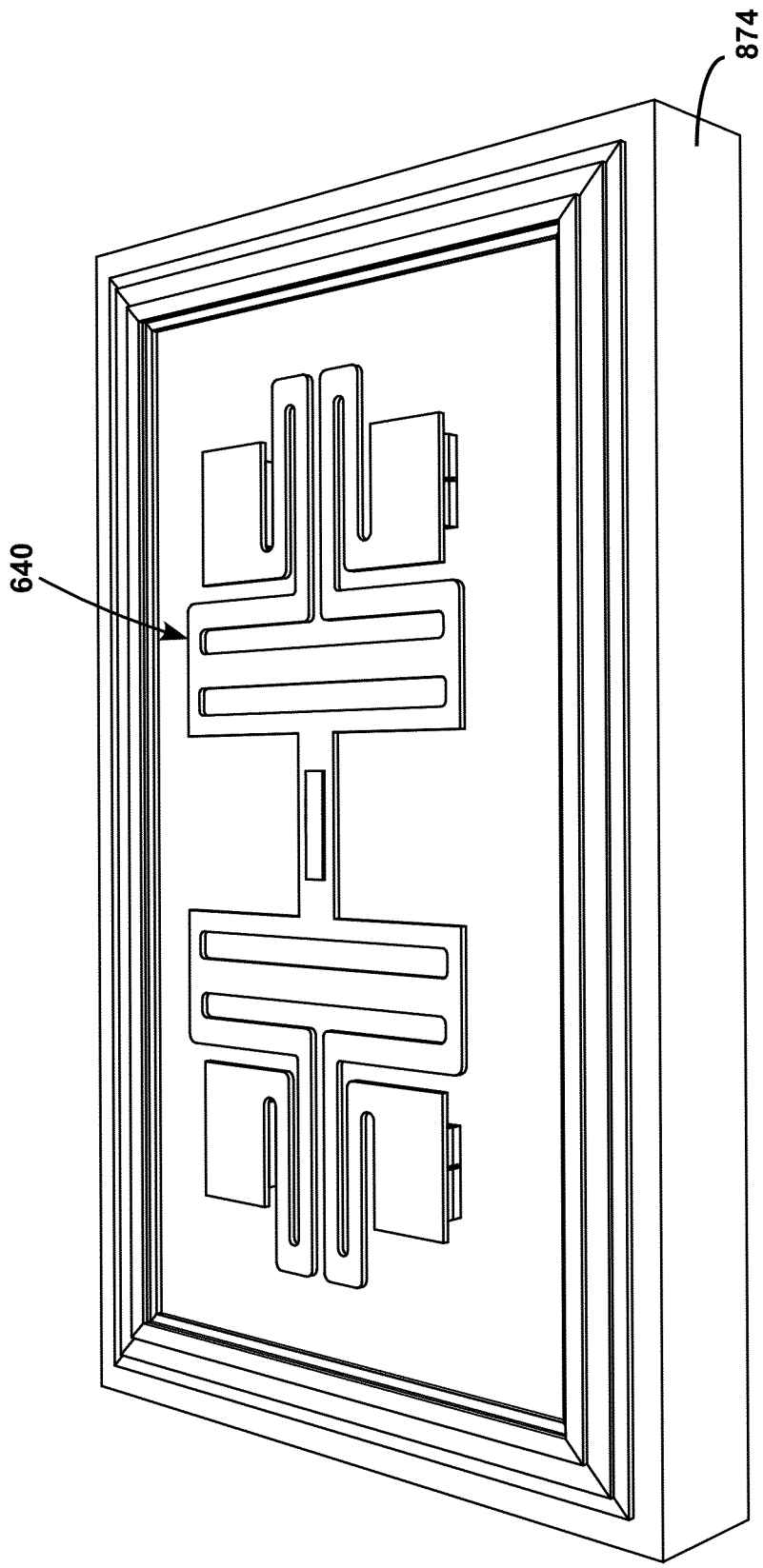
FIG. 6 shows a doubly clamped resonator integrated on a base substrate in accordance with the present disclosure.
Figure 7:
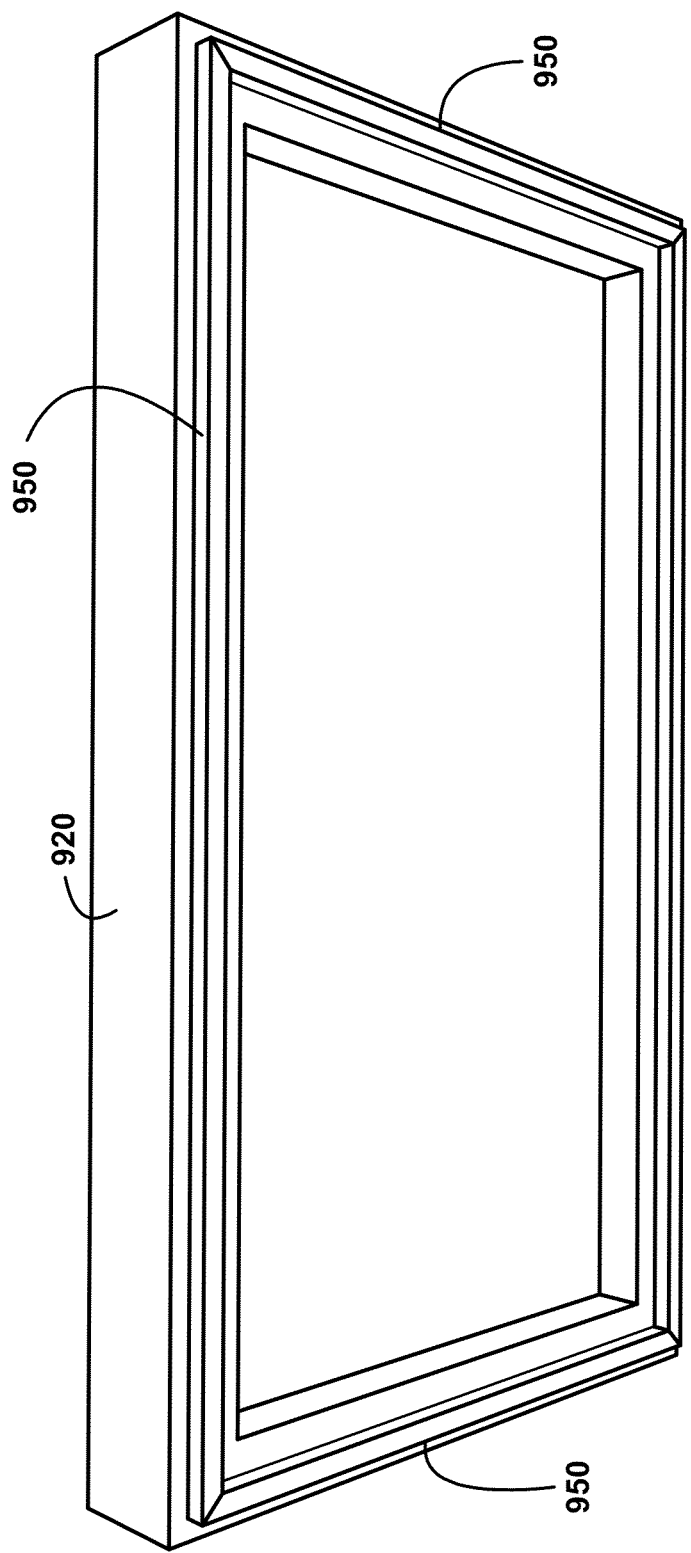
FIG. 7 shows a silicon cap with a preformed cavity in accordance with the present disclosure.

FIG. 5 shows anchor pads 380 on the base substrate 874 before the finished quartz device 640 is integrated onto the base substrate 874 by means of metal-metal thermo-compression bonding. The anchor pads 380 may be formed of layers of the same or different metals. Although FIG. 5 shows four anchor pads 380, there may be fewer or more anchor pads. FIG. 6 shows a doubly clamped resonator 640 integrated on a base substrate 874. Finally, FIG. 7 shows the silicon cap 920 with the cavity 945 and seal ring 950 before the silicon cap 920 is bonded to the base substrate 874.

In summary, the doubly clamped resonator of the present disclosure reduces vibration-dependent frequency drifts in a quartz micro-resonator, and thereby improves resonator frequency stability.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . "

What is claimed is:

1. A resonator comprising:
a base substrate having a first, second, third and fourth anchor pads;
a quartz resonator device comprising:
a resonant microbridge;
an electrode on the microbridge;
a first flexure beam connected to a first end of the microbridge;
a second flexure beam connected to a second end of the microbridge;
a first spring connected between the first flexure beam and a first anchor mount, the first anchor mount coupled to the first anchor pad;
a second spring connected between the first flexure beam and a second anchor mount, the second anchor mount coupled to the second anchor pad;
a third spring connected between the second flexure beam and a third anchor mount, the third anchor mount coupled to the third anchor pad;
a fourth spring connected between the second flexure beam and a fourth anchor mount, the fourth anchor mount coupled to the fourth anchor pad;
wherein a single quartz crystal comprises the microbridge, the first and second flexure beams, the first, second, third and fourth springs, and the first, second, third and fourth anchor mounts; and
wherein the flexure beams and the springs prevent buildup of stress in the microbridge.

2. The resonator of claim 1 wherein:
a length of the microbridge is greater than a width of the microbrige.

3. The resonator of claim 1 wherein:
a thickness of the microbridge is dependent on a desired resonate frequency.

4. The resonator of claim 1 wherein:
the quartz resonator device comprises AT-cut quartz.

5. The resonator of claim 1 wherein:
the electrode is near the middle of the microbridge.

6. The resonator of claim 1 wherein:
the springs have a serpentine configuration.

7. The resonator of claim 1 wherein:
the springs are formed by cutouts or removed areas in the single quartz crystal.

8. The resonator of claim 1 wherein:
the first and second springs are each connected to the first flexure beam near a middle of the length of the first flexure beam; and
the third and fourth springs are each connected to the second flexure beam near a middle of the length of the second flexure beam.

9. The resonator of claim 1 wherein:
the first spring is connected to the first flexure beam near a first end of the length of the first flexure beam;
the second spring is connected to the first flexure beam near a second end of the length of the first flexure beam;
the third spring is connected to the second flexure beam near a first end of the length of the second flexure beam; and
the fourth spring is connected to the second flexure beam near a second end of the length of the second flexure beam.

10. The resonator of claim 1 wherein:
the flexure beams are formed by cutouts or removed areas in the single quartz crystal.

11. The resonator of claim 1 wherein:
the electrode is near the middle of the microbridge.

12. The resonator of claim 1 further comprising:
a cap having a cavity over the quartz resonator device, the cap bonded to the base substrate for keeping the quartz resonator device in a stable environment.

13. A method of fabricating a resonator comprising:
depositing top-side metal on a top of a quartz device wafer to form a resonator electrode;
bonding a quartz handle to the quartz device wafer;
thinning and planarizing the quartz device wafer to achieve a desired thickness and uniformity;
patterning and etching the quartz device wafer to form a via for electrical contact between the top and a bottom of the quartz device wafer;
depositing metal to form a via interconnect between the top and the bottom of the quartz device wafer;
depositing and patterning bottom side metal to form a bottom side resonator electrode;
etching the thinned quartz device wafer to form a resonant microbridge, a first flexure beam connected to a first end of the microbridge, a second flexure beam connected to a second end of the microbridge, a plurality of anchor mounts, and a respectively plurality of springs, each spring between a respective anchor mount and the first flexure beam or the second flexure beam;
bonding each anchor mount to a respective anchor pad on a base substrate; and
releasing the bond between the quartz handle and the quartz device wafer.

14. The method of claim 13 further comprising:
bonding a cap to the base substrate, the cap having a cavity over the quartz device wafer for keeping the quartz resonator device in a stable environment.

15. The method of claim 14 wherein the cap comprises silicon.

16. The method of claim 14 further comprising etching slits in the cap to provide for heat exchange.

17. The method of claim 13 wherein:
bonding the quartz handle to the quartz device wafer comprises fusion bonding or using a temporary adhesive such as petroleum-based wax to bond the quartz handle to the quartz device wafer.

18. The method of claim 13 wherein:
thinning and planarizing the quartz device wafer comprises using chemical mechanical planarization (CMP) and selective milling.

19. The method of claim 13 wherein:
bonding each anchor mount to a respective anchor pad on the base substrate comprises metal-metal thermo-compression bonding.

20. The method of claim 13 wherein:
releasing the bond between the quartz handle and the quartz device wafer comprises soaking the quartz handle and quartz device wafer in an appropriate solvent to un-bond or dissolve the adhesive between the quartz device wafer and the quartz handle.

21. The method of claim 13 wherein etching the quartz device wafer to form the via for electrical contact between the top and the bottom of the quartz device wafer comprises using an inductively coupled plasma (ICP) dry etcher.

22. The method of claim 13 wherein etching the thinned quartz device wafer to form a resonant microbridge, a first flexure beam connected to a first end of the microbridge, a second flexure beam connected to a second end of the microbridge, a plurality of anchor mounts, and a respectively plurality of springs, each spring between a respective anchor mount and the first flexure beam or the second flexure beam comprises:
etching the thinned quartz device wafer to form:
a resonant microbridge;
a first flexure beam connected to a first end of the microbridge;
a second flexure beam connected to a second end of the microbridge;
a first spring connected to the first flexure beam;
a first anchor mount, the first anchor mount connected to the first spring;
a second spring connected to the first flexure beam;
a second anchor mount, the second anchor mount connected to the second spring;
a third spring connected to the second flexure beam;
a third anchor mount, the third anchor mount connected to the third spring;
a fourth spring connected to the second flexure beam; and
a fourth anchor mount, the fourth anchor mount connected to the fourth spring.

23. A resonator comprising:
a base substrate having a first and second anchor pads;
a quartz resonator device comprising:
a resonant microbridge;
a first flexure beam connected to a first end of the microbridge;
a second flexure beam connected to a second end of the microbridge;
a first spring connected between the first flexure beam and a first anchor mount, the first anchor mount coupled to the first anchor pad; and
a second spring connected between the second flexure beam and a second anchor mount, the second anchor mount coupled to the second anchor pad;
wherein a single quartz crystal comprises the microbridge, the first and second flexure beams, the first and second springs, and the first and second anchor mounts.

24. The resonator of claim 23 wherein the single quartz crystal is crystalline quartz.

25. The resonator of claim 23 wherein:
the quartz resonator device comprises AT-cut quartz.

26. The resonator of claim 23 further comprising:
an electrode on the microbridge.

27. A method of fabricating a resonator comprising:
forming from a single quartz crystal a quartz resonator device comprising:
a resonant microbridge;
a first flexure beam connected to a first end of the microbridge;
a second flexure beam connected to a second end of the microbridge;
a first spring connected between the first flexure beam and a first anchor mount; and
a second spring connected between the second flexure beam and a second anchor mount.

28. The method of claim 27 wherein:
the quartz resonator device comprises AT-cut quartz.

29. The method of claim 27 further comprising:
forming an electrode on the microbridge.

30. The method of claim 27 further comprising:
providing a base substrate having a first and second anchor pads;
coupling the first anchor mount to the first anchor pad; and
coupling the second anchor mount to the second anchor pad.

31. The method of claim 27 wherein the single quartz crystal quartz is crystalline quartz.

* * * * *